April 29, 1969 K. SIWKO 3,441,865

INTER-STAGE COUPLING CIRCUIT FOR NEUTRALIZING INTERNAL FEEDBACK IN TRANSISTOR AMPLIFIERS

Filed May 14, 1965

UN-NEUTRALIZED PRIOR ART AMPLIFIER

INVENTOR.
KAROL SIWKO
BY Eugene M. Whitacre
Attorney

United States Patent Office 3,441,865

Patented Apr. 29, 1969

3,441,865

INTER-STAGE COUPLING CIRCUIT FOR NEUTRALIZING INTERNAL FEEDBACK IN TRANSISTOR AMPLIFIERS

Karol Siwko, Indianapolis, Ind., assignor to Radio Corporation of America, a corporation of Delaware Filed May 14, 1965, Ser. No. 455,708

Int. Cl. H03f 3/04, 3/68, 1/00

U.S. Cl. 330—21 12 Claims

ABSTRACT OF THE DISCLOSURE

Neutralization of the inter-electrode collector-to-base feedback of a transistor amplifier is accomplished by coupling input signals to the amplifier through a parallel-resonant circuit having an inductive component, a capacitive component, and a resistive component having a resistance value at least several times less than the value of the input reactance of the amplifier stage at the applied signal frequency.

This invention relates to an inter-stage coupling circuit for neutralizing the effects of internal feedback within the semiconductor device used in transistor amplifier circuits.

The need for neutralizing the effects of internal feedback within the semiconductor device used in transistor amplifier circuits is well recognized in the prior art. Whether the transistor amplifier is tuned or not, the fact is that the inter-electrode capacitance of the transistor included within the amplifier—more particularly, the collector-base inter-electrode capacitance—has a tendency to introduce unwanted feedback signals from the output circuit into the input circuit. This tendency becomes more pronounced at the relatively high frequencies where regenerative or positive feedback can cause uncontrolled oscillations in the amplifier and/or where degenerative or negative feedback can cause reductions in amplifier gain.

The above problems are especially acute in multi-stage, tuned transistor amplifier circuits, such as are found in the picture I.F. portion of a television receiver. If no neutralization is there provided, then even a slight mistuning in one of the stages can cause it to oscillate, and, by stray feedback, can cause oscillations to break out in all of the stages of the amplifier. There too, without neutralization, any tendency for the input and/or output impedances of the individual transistors to vary over their operating lives can cause substantial changes in the gain and bandwidth characteristics of each stage. These changes may not be tolerable and if not, like the oscillations, must be compensated for.

A number of circuit arrangements have therefore been devised to neutralize the effects brought about by this collector-base inter-electrode capacitance. Each of these circuit arrangements, by and large, operates to feed back a voltage from the output of the transistor amplifier device to the input such that at the input, the voltage is equal in magnitude but opposite in phase to the feedback voltage through the inter-electrode capacitance. The neutralizing feedback energy then cancels the feedback energy transferred directly between electrodes of the transistor. One such arrangement employs a series capacitor-resistor network connected between the output electrode of the amplifier transistor and the primary coil of the input transformer. A second arrangement employs a series capacitor-resistor network connected between an output winding of the amplifier and the secondary coil of the input transformer. A third arrangement employs a series capacitor-resistor network connected between the output and input electrodes of the transistor.

It will be evident that each of these three circuit arrangements, as well as most others known in the prior art, uses a feedback capacitor to effect neutralization. In some arrangements, a small capacitor is sufficient. In other arrangements a large capacitor is required. In many arrangements, the capacitor is variable or, if fixed, is shunted by a variable trimmer capacitor, so as to be usable to its fullest extent with transistors having a relatively wide variation in collector-base inter-electrode capacitance from one to another. These capacitors, whether small, large, fixed, variable, or shunted represent increased cost to the individual transistor amplifier stage.

It is an object of the present invention, therefore, to provide a neutralizing arrangement for a transistor amplifier circuit which eliminates the need altogether for the heretofore used feedback capacitor.

It is another object of the invention to provide such a neutralizing arrangement without adding any off-setting cost to that saved by the elimination of that capacitor.

It is an additional object of the invention to provide such an arrangement which insures stability of amplifier operation even though the transistors employed may exhibit a relatively wide variation in inter-electrode capacitance from one to another.

It is a further object of the present invention to provide such an arrangement which substantially reduces the gain variations between stages of a multi-stage transistor amplifier due to variations in the input and/or output impedances of the individual transistors employed.

As will become clear hereinafter this is accomplished by the use of a novel type of coupling circuit arrangement, which, in effect, acts as an impedance transformer device between the preceding transistor stage and the next succeeding transistor stage.

For a better understanding of the present invention, together with other and further objects thereof, reference is to be had to the following description taken in connection with the accompanying drawings, and its scope will be pointed out in the appended claims.

Referring to the drawings.

Figures 1, 2, 3, 4A, 4B:
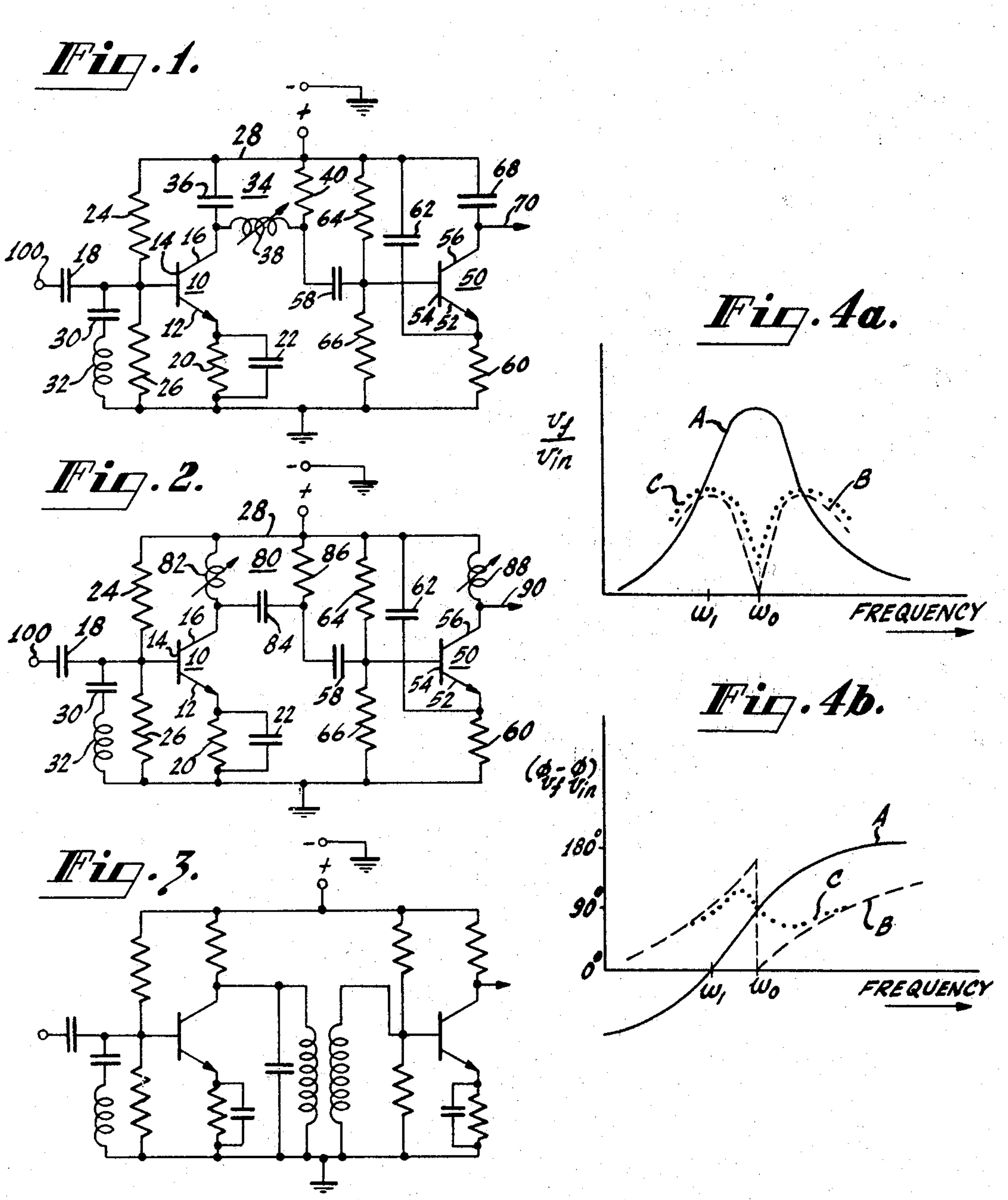
FIGURE 1 shows a schematic diagram of a transistor amplifier circuit including an inter-stage coupling circuit constructed in accordance with a particular form of the present invention.
FIGURE 2 shows a transistor amplifier circuit including a modified form of inter-stage coupling circuit in accordance with the invention.

FIGURE 3 shows a schematic diagram of an unneutralized transistor amplifier circuit including an inter-stage coupling circuit commonly employed in the prior art; and FIGURES 4*a* and 4*b* show the amplitude and phase characteristics respectively of the internal feedback voltage as a function of frequency in the transistor amplifier circuits of FIGURES 1–3, inclusive, none of which employ the customary feedback capacitor.

In FIGURE 1, transistor 10, having emitter, base, and collector electrodes 12, 14 and 16, respectively, represents the first I.F. stage of a television receiver. The base electrode 14 is connected via a coupling capacitor 18 to the output of a first detector included in the television tuner and represented by the terminal 100, while the emitter electrode 12 is connected through a conventional emitter resistor 20 and shunt-connected by-pass capacitor 22 to ground. A D.C. bias voltage is provided for the base electrode 14 by the resistors 24 and 26, serially connected between ground and a positive potential conductor 28. Capacitor 30 and inductor 32 are serially connected between the base electrode 14 and ground to form a series tuned trap resonant at 41.25 megacycles in order to appropriately attenuate the sound intermediate frequency signal.

An inter-stage coupling circuit 34 is connected to the collector electrode 16 of transistor 10. Coupling circuit 34 includes a capacitor 36, an inductor 38, and a resistor 40. One side of capacitor 36 is connected to the collector electrode 16. The other side of capacitor 36 is connected to the positive conductor 28, though in an alternative arrangement, it may be connected to ground instead. One end of inductor 38 is connected to the junction of capacitor 36 and the collector electrode 16, while the other end is connected to one end of the resistor 40. The other end of resistor 40 is also connected to the conductor 28. Inductor 38 is shown as being variable so as to tune the coupling circuit 34 to the video intermediate frequency, for example, 45.75 megacycles. It will be readily apparent that as an alternative, inductor 38 may be of a fixed value and capacitor 36 made variable in order to tune the circuit 34 to this frequency. Viewed from the collector electrode 16 of transistor 10, the inter-stage coupling circuit 34 appears as a parallel-resonant circuit.

A second I.F. stage is also shown in FIGURE 1. This stage includes a transistor 50 having emitter, base, and collector electrodes 52, 54, and 56, respectively. The base electrode 54 is connected via a coupling capacitor 58 to the junction of inductor 38 and resistor 40, while the emitter electrode 52 is connected through an emitter resistor 60 to ground. The emitter electrode 52 is also connected through a by-pass capacitor 62 to the positive conductor 28. A D.C. bias voltage is provided for the base electrode 54 by the resistors 64 and 66, serially connected between ground and the conductor 28. The capacitor 68 and the conductor 70 are intended to represent the beginning of a second inter-stage coupling circuit connected between the collector electrode 56 and the third I.F. stage. It will be understood that this coupling circuit may be similar to the coupling circuit 34 connected to the collector electrode 16 of transistor 10. Although shown as being of a fixed value, capacitor 68 may be variable, instead of the inductor of the second coupling circuit, as was previously mentioned. Viewed from the base electrode 54 of transistor 50, the inter-stage coupling circuit 34 appears as a series-resonant circuit.

In the operation of the tuned transistor amplifier of FIGURE 1, it has been found that as the value of the resistor 40 included within the inter-stage coupling circuit 34 is decreased, the ratio of the inter-electrode feedback voltage to the input voltage to the transistor also decreases. It has also been found that if the value of the resistor 40 is chosen to be at least several times less than the input reactance of the following transistor stage, this ratio can be made to approximate zero. How close the ratio ultimately comes to zero depends upon the resistance losses within the stage itself—the less the resistance losses, the closer to zero the ratio comes. But even if the resistance losses can not be eliminated altogether, it has been found that the ratio still is very much smaller than the corresponding ratio in I.F. transistor amplifiers that include no neutralizing capacitor, one example of which is shown in FIGURE 3. The extent to which this ratio of feedback voltage to input voltage in the arrangement of FIGURE 1 is less than the ratio in FIGURE 3 type arrangements is such that problems involving stability of amplifier operation are substantially eliminated. Thus, by choosing resistor 40 in FIGURE 1 to be of a value at least two or three times less than the input reactance of transistor 50 at the I.F. frequency, neutralization can be accomplished without the need for the heretofore used feedback capacitor. It has further been found that with such a choice of resistance value, this neutralization is only slightly affected by the differences that exist in the inter-electrode capacitances between the different transistors of the same type classification that may be used in the arrangement. With resistor 40 chosen to be of a value equal to 18 ohms, approximately ten times less than the 250 ohms input reactance of transistor 50 at the I.F. frequency, it was found that this neutralization was virtually independent of the differences in these transistor parameters.

There is shown in FIGURE 2 a second I.F. transistor amplifier configuration which uses an alternative form of inter-stage coupling circuit. Except for electrical connections to and within the coupling circuit, denoted by the number 80, the configuration of FIGURE 2 is identical to that of FIGURE 1. Those components of FIGURE 2 which are identical to corresponding components of FIGURE 1 have, therefore, been given the same reference number.

In the configuration of FIGURE 2, and more particularly, in the inter-stage coupling circuit 80, one end of an inductor 82 is connected to the collector electrode 16 of transistor 10. The other end is connected to the positive potential conductor 28, though in an alternative arrangement, it may be connected to ground instead. One side of a capacitor 84 is connected to the junction of inductor 82 and the collector electrode 16, while the other side is connected to one end of a resistor 86. That end is also connected via coupling capacitor 58 to the base electrode 54 of the second I.F. transistor 50. The other end of resistor 86 is connected to the positive conductor 28. As in FIGURE 1, inductor 82 is shown as the variable tuning component though it will be appreciated that tuning may be effected by varying capacitor 84 instead. The inductor 88 and the conductor 90 in FIGURE 2 are intended to represent the beginnings of the next inter-stage coupling circuit.

It has been found that similar neutralization characteristics are displayed by the inter-stage coupling circuit of FIGURE 2 as are displayed by the FIGURE 1 arrangement. Thus, by choosing resistor 86 to be at least several times less in value than the input reactance of transistor 50 at the operating I.F. frequency, neutralization can still be had, and with a cost savings of the previously used feedback capacitor. The neutralization characteristic exhibited is once again only slightly affected by stray resistance losses within the circuit and/or inter-electrode capacitance variations.

FIGURE 4(*a*) shows the amplitude characteristics of the internal feedback voltage of the transistor amplifier stage relative to the input voltage, measured along the ordinate, as a function of frequency, measured along the abscissa, for the configurations of FIGURES 1–3. A represents the amplitude characteristics for the prior art amplifier configuration of FIGURE 3, i.e., without a feedback capacitor for neutralization. B represents the amplitude characteristics for the amplifier configurations either of FIGURE 1 or FIGURE 2 assuming the absence of stray resistance loss. C represents the amplifier characteristic for the same amplifier configurations in the presence of stray resistance loss. It will be apparent from these three curves that at the tuned resonant frequency, the video intermediate frequency, neutralization has already been effected in the FIGURE 1 and FIGURE 2 configurations (dashed-line curve B and dotted-line curve C), whereas some neutralization scheme must be added to the FIGURE 3 configuration (solid-line curve A) in order to prevent it from becoming unstable in its operation. Amplitude characteristics B and C are represented as shown because of the impedance characteristics of the interstage coupling circuit 34. Viewed from the base electrode 54 of transistor 50, the coupling circuit 34 appears as a short circuit at the resonant frequency $\omega_0$ and as some complex impedance at other frequencies where capacitor 36 and inductor 38 effectively shunt resistor 40.

FIGURE 4(*b*) shows the phase characteristics of the feedback voltage of the transistor amplifier stage relative to the input voltage, measured along the ordinate, as a function of frequency, measured along the abscissa, for the configurations of FIGURES 1–3. These phase characteristics can be used to further illustrate the self-neutralization feature of the present invention. In FIGURE 4(*b*): A represents the phase characteristic for the prior art amplifier configuration of FIGURE 3; B represents the phase characteristic for the amplifier configurations either of FIGURE 1 or FIGURE 2 assuming the absence of stray resistance loss; and C represents the phase characteristic for the same amplifier configurations in the presence of stray resistance loss. Referring to FIGURE 4(*a*), it will be seen that at frequency $\omega_1$, a frequency other than the resonant frequency, the amplitudes of the feedback voltages for all three configurations are approximately equal. As shown in FIGURE 4(*b*), the feedback voltage for the prior art configuration at this frequency is directly in phase with the input voltage (phase characteristic A). This is the condition at which the feedback voltage will have its greatest effect on amplifier operation. As is also shown in FIGURE 4(*b*), however, the feedback voltages at this same frequency for the configurations constructed according to this invention are shifted approximately 90° out of phase with respect to the input voltage (phase characteristics B and C). It will be readily apparent that such a phase shift significantly reduces the effect that the given feedback voltage will have on the operations of the transistor amplifier configuration.

Besides being constructed so as to provide neutralization without the use of a feedack capacitor, the tuned transistor amplifier configurations of the present invention are constructed so as to substantially reduce any gain variations in the individual stages that may result from variations in the input and/or output impedance of the transistors employed. As is well known and understood, these variations in gain, as well as the accompanying changes in bandwidth, can not be tolerated in a video I.F. amplifier.

In the transistor I.F. amplifier configurations of FIGURES 1 and 2, however, the inter-stage coupling circuits 34 and 80, respectively, are, in effect, parallel-resonant transformers. The empedance transformation which they establish between I.F. stages, therefore, is such as to "swamp out" or nullify to a great extent the effect of any impedance changes. Assuming that the value of the inter-stage coupling resistor (40 in FIGURE 1, 86 in FIGURE 2) is many times smaller than the reactance of the inter-stage coupling capacitor (36 in FIGURE 1, 84 in FIGURE 2) at the tuned I.F. frequency, it can be shown that the impedance transformation ratio varies according to the expression $(\frac{1}{2}\pi f_0 RC)^2$, where $f_0$ represents the tuned resonant frequency, R represents the value of the inter-stage coupling resistor, and C respresents the value of the inter-stage coupling capacitor. Thus, adjustment of different values for the inter-stage coupling resistor will not only provide the requisite feedback neutralization, but will also provide the desired impedance transformation to stabilize the amplifier gain and bandwidth.

It will be obvious to those skilled in the art that, while the present invention has been described as it would be used within the video I.F. portion of a television receiver, its teachings are equally applicable in any environment, and at any frequency, where it is desired to neutralize the effects of voltage feedback through the inter-electrode capacitance of a transistor. It will be equally obvious that while NPN transistors have been used in the two embodiments of the invention disclosed, and used in the common-emitter coinfigurations, neither is to be construed as a limiting factor of the invention. Various changes and modifications may be made in these, and other, respects without departing from the true spirit and scope of the invention.

What is claimed is:

1. An amplifier circuit comprising:
a source of input signals to be amplified;
a transistor stage for amplifying said signals;
and means for coupling said input signals to said transistor stage, said means including a parallel-resonant circuit having an inductive component, a capacitive component connected therewith to form a first junction coupled to said source of input signals, and a resistive component, with said resistive component and one of said inductive and capacitive components defining a second junction which is coupled to the input of said transistor stage, and wherein the value of said resistive component is at least several times less than the value of the input reactance of said transistor stage.

2. An amplifier circuit comprising:
a first transistor having a collector electrode at which signals to be amplified are developed;
a second transistor having a base electrode and a collector electrode, and exhibiting an inter-electrode capacitance having a tendency to feedback a signal from the collector electrode to the base electrode;
and means for coupling the signals from the collector electrode of said first transistor to the base electrode of said second transistor to be amplified thereby, said means including a parallel-resonant circuit having a first reactive component connected between the collector electrode of said first transistor and a first source of uni-directional potential, a resistive component connected between a second source of uni-directional potential and one end of a second reactive component included within said resonant circuit and coupled to the base electrode of said second transistor, the other end of said second reactive component being connected to the junction of said first reactive component and said first collector electrode, and wherein the value of said resistive component is at least several times less than the input reactance of said second transistor.

3. An amplifier circuit comprising:
a first transistor having a collector electrode at which signals to be amplified are developed;
a second transistor having a base electrode and a collector electrode, and exhibiting an inter-electrode capacitance having a tendency to feedback a signal from the collector electrode to the base electrode;
and means for coupling the signals from the collector electrode of said first transistor to the base electrode of said second transistor to be amplified thereby, said means including a parallel-resonant circuit having a first reactive component connected between the collector electrode of said first transistor and a source of reference potential, a resistive component connected between a source of uni-directional potential and one end of a second reactive component included within said resonant circuit and coupled to the base electrode of said second transistor, the other end of said second reactive component being connected to the junction of said first reactive component and said first collector electrode, and wherein the value of said resistive component is at least several times less than the input reactance of said second transistor.

4. An amplifier circuit according to claim 2 in which said first reactive component is a capacitor and said second reactive component is an inductor.

5. An amplifier circuit according to claim 2 in which said first reactive component is an inductor and said second reactive component is a capacitor.

6. An amplifier circuit according to claim 2 in which said first and second transistors are connected in a common emitter configuration.

7. An amplifier circuit according to claim 2 for use in the video intermediate frequency portion of a television receiver in which said first reactive component is tuned with respect to said second reactive component to provide maximum application for signals having a frequency equal to the intermediate frequency of said video portion and in which the value of said resistive component is substantially less than the reactance of said second transistor at said intermediate frequency.

8. An amplifier circuit according to claim 2 in which said feedback signal is effectively short circuited to ground through said parallel-resonant circuit at the resonant frequency thereof.

9. An amplifier circuit comprising:

a source of input signals to be amplified;

a transistor stage for amplifying said signals;

and means for coupling said input signals to said transistor stage, said means including a parallel-resonant circuit having an inductive component, a capacitive component connected therewith to form a first junction coupled to said source of input signals, and a resistive component forming a closed loop at the resonant frequency thereof, with said resistive component and one of said inductive and capacitive components defining a second junction which is coupled to the input of said transistor stage, and wherein the value of said resistive component is at least several times less than the value of the input reactance of said transistor stage.

10. An amplifier circuit comprising:

a first transistor having a collector electrode at which signals to be amplified are developed;

a second transistor having a base electrode and a collector electrode, and exhibiting an inter-electrode capacitance having a tendency to feed back a signal from the collector electrode to the base electrode;

and means for coupling the signals from the collector electrode of said first transistor to the base electrode of said second transistor to be amplified thereby, said means including a parallel-resonant circuit having a first reactive component connected between the collector electrode of said first transistor and a source of uni-directional potential, a resistive component connected between a source of reference potential and one end of a second reactive component included within said resonant circuit and coupled to the base electrode of said second transistor, the other end of said second reactive component being connected to the junction of said first reactive component and said first collector electrode, and wherein the value of said resistive component is at least several times less than the input reactance of said second transistor.

11. An amplifier circuit as defined in claim 2 wherein said first source and said second source are of substantially the same uni-directional potential value.

12. An amplifying circuit comprising:

a source of input signals;

a signal amplifying device;

and means for coupling said input signals to said amplifying device, said means including a resonant circuit having an inductive component, a capacitive component, and a resistive component;

wherein intermediate signals are developed at a junction of said inductive and capacitive components in response to said input signals, wherein further signals are developed across said resistive component in response to said intermediate signals and applied between the input electrodes of said amplifying device for amplification thereby, and wherein the value of said resistive component is at least several times less than the value of the input reactance of said device.

References Cited

UNITED STATES PATENTS 3,302,123 1/1967 Schweickert ______ 330—31 XR

OTHER REFERENCES

Motorola Application notes, 1-1961 AN 121 "I-F Amplifiers with the 2N741 Mesa Transistor," Rheinfelder.

JOHN KOMINSKI, *Primary Examiner.*

SIEGFRIED H. GRIMM, *Assistant Examiner.*

U.S. Cl. X.R.

330—31, 176; 333—76; 325—489